(12) United States Patent
Long et al.

(10) Patent No.: US 9,515,633 B1
(45) Date of Patent: Dec. 6, 2016

(54) TRANSFORMER COUPLED CAPACITIVE TUNING CIRCUIT WITH FAST IMPEDANCE SWITCHING FOR PLASMA ETCH CHAMBERS

(71) Applicant: Lam Research Corporation, Fremont, CA (US)

(72) Inventors: Maolin Long, Santa Clara, CA (US); Alex Paterson, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/992,558

(22) Filed: Jan. 11, 2016

(51) Int. Cl.
*H01J 23/16* (2006.01)
*H03H 7/40* (2006.01)
*H01J 37/32* (2006.01)

(52) U.S. Cl.
CPC ............ *H03H 7/40* (2013.01); *H01J 37/32009* (2013.01)

(58) Field of Classification Search
CPC .................. H01J 37/32009; H05H 1/24; H05H 2001/4652
USPC ........ 315/56–58, 111.21, 111.71; 313/231.31
See application file for complete search history.

(56) References Cited

U.S. PATENT DOCUMENTS

| | | | |
|---|---|---|---|
| 5,401,350 A | 3/1995 | Patrick et al. | |
| 5,578,165 A | 11/1996 | Patrick et al. | |
| 5,589,737 A | 12/1996 | Barnes et al. | |
| 5,770,982 A | 6/1998 | Moore | |
| 5,936,481 A * | 8/1999 | Fujii | H03H 7/40 333/17.3 |
| 5,952,896 A | 9/1999 | Mett et al. | |
| 6,054,013 A | 4/2000 | Collins et al. | |
| 6,254,738 B1 * | 7/2001 | Stimson | H01F 29/10 |
| 6,313,584 B1 | 11/2001 | Johnson et al. | |
| 7,218,899 B2 | 5/2007 | Sorrells et al. | |
| 7,480,571 B2 * | 1/2009 | Howald | H01J 37/32082 702/1 |
| 7,539,474 B2 | 5/2009 | Sorrels et al. | |
| 7,764,140 B2 * | 7/2010 | Nagarkatti | H03F 1/56 156/345.28 |
| 7,780,814 B2 | 8/2010 | Pipitone et al. | |
| 7,811,410 B2 | 10/2010 | Leming et al. | |
| 9,059,678 B2 | 6/2015 | Long et al. | |
| 9,320,126 B2 * | 4/2016 | Valcore, Jr. | H05H 1/46 |

(Continued)

OTHER PUBLICATIONS

Model for a Large Area Multi-frequency Multiplanar Coil Inductively Coupled Plasma Source; Naoki, Yamada; J. Vac. Sci. Technol. A 14(5); Sep./Oct. 1996.

(Continued)

*Primary Examiner* — Jason M Crawford

(57) ABSTRACT

A transformer coupled capacitive tuning (TCCT) circuit for an inductively coupled plasma (ICP) chamber includes a matching circuit including a first switched capacitor circuit and a first inductor. The first switched capacitor circuit includes a first terminal, a second terminal, a first capacitor connected to at least one of the first terminal and the second terminal, a second capacitor connected to at least one of the first terminal and the second terminal, and a first switch in communication with at least one of the first capacitor and the second capacitor to vary a capacitance value between the first terminal and the second terminal. A power splitter communicates with the matching circuit and an inductive coil of the ICP chamber.

13 Claims, 10 Drawing Sheets

(56) References Cited

U.S. PATENT DOCUMENTS

| | | | | |
|---|---|---|---|---|
| 2003/0001511 A1* | 1/2003 | Howald | ............... | H01J 37/321 |
| | | | | 315/111.21 |
| 2004/0027209 A1* | 2/2004 | Chen | ................. | H01J 37/32082 |
| | | | | 333/17.3 |
| 2010/0314048 A1* | 12/2010 | Long | .................... | H01J 37/321 |
| | | | | 156/345.48 |
| 2012/0262064 A1* | 10/2012 | Nagarkatti | ........ | H01J 37/32082 |
| | | | | 315/111.21 |
| 2013/0106286 A1 | 5/2013 | Banna et al. | | |
| 2013/0134129 A1 | 5/2013 | Todorow et al. | | |
| 2013/0135058 A1* | 5/2013 | Long | ........................ | H03H 7/40 |
| | | | | 333/32 |
| 2015/0235810 A1* | 8/2015 | Long | ................ | H01J 37/32183 |
| | | | | 156/345.51 |
| 2015/0349750 A1* | 12/2015 | Van Zyl | ............ | H01J 37/32183 |
| | | | | 315/111.21 |

OTHER PUBLICATIONS

"H Bridge." Wikipedia. Wikimedia Foundation, n.d. Web. Dec. 15, 2014. 5 pages.

\* cited by examiner

TRANSFORMER COUPLED CAPACITIVE TUNING CIRCUIT WITH FAST IMPEDANCE SWITCHING FOR PLASMA ETCH CHAMBERS

FIELD

The present disclosure relates generally to substrate processing systems and more particularly to transformer coupled capacitive tuning (TCCT) circuits with fast impedance switching for plasma etch chambers.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to etch thin film on substrates such as semiconductor wafers. Etching usually includes either wet chemical etching or dry etching. Dry etching may be performed using plasma generated by inductively-coupled plasma (ICP). The inductively-coupled plasma may be generated by coils arranged outside of a processing chamber adjacent to a dielectric window. Process gas flowing inside the processing chamber is ignited to create plasma.

SUMMARY

A transformer coupled capacitive tuning (TCCT) circuit for an inductively coupled plasma (ICP) chamber includes a matching circuit including a first switched capacitor circuit and a first inductor. The first switched capacitor circuit includes a first terminal, a second terminal, a first capacitor connected to at least one of the first terminal and the second terminal, a second capacitor connected to at least one of the first terminal and the second terminal, and a first switch in communication with at least one of the first capacitor and the second capacitor to vary a capacitance value between the first terminal and the second terminal. A power splitter communicates with the matching circuit and an inductive coil of the ICP chamber.

In other features, the first capacitor and the second capacitor include motor-controlled vacuum capacitors. The matching circuit further includes a second switched capacitor circuit. The second switched capacitor circuit includes a third terminal, a fourth terminal, a third capacitor connected to at least one of the third terminal and the fourth terminal, a fourth capacitor connected to at least one of the third terminal and the fourth terminal, and a second switch in communication with at least one of the third capacitor and the fourth capacitor to vary a capacitance value between the third terminal and the fourth terminal.

In other features, the third capacitor and the fourth capacitor include motor-controlled vacuum capacitors. The first terminal receives an RF input signal, the second terminal is connected to a first terminal of a fifth capacitor and to the third terminal of the second switched capacitor circuit, and the fourth terminal of the second switched capacitor circuit is connected to a first terminal of the first inductor.

In other features, the power splitter includes a third capacitor having a first terminal connected to an output of the matching circuit. A fourth capacitor has a first terminal connected to a second terminal of the third capacitor and a second terminal in communication with a first coil. A fifth capacitor has a first terminal connected to the output of the matching circuit. A second inductor includes a first terminal connected to a second terminal of the fifth capacitor. A sixth capacitor has a first terminal connected to a second terminal of the second inductor and a second terminal connected to a second coil. A seventh capacitor is connected to the first coil.

In other features, the fourth capacitor and the sixth capacitor include switched capacitor circuits. The first switched capacitor circuit includes a first terminal and a second terminal. The first capacitor is connected to the first terminal of the first switched capacitor circuit. The second capacitor is connected to the first terminal of the first switched capacitor circuit. The first switch is connected between the first capacitor and the second terminal of the first switched capacitor circuit. A second switch is connected between the second capacitor and the second terminal of the first switched capacitor circuit.

In other features, the first switched capacitor circuit includes a first terminal and a second terminal. The first capacitor is connected to the first terminal of the first switched capacitor circuit. The second capacitor is connected to the first terminal and the second terminal of the first switched capacitor circuit. The first switch is connected between the first capacitor and the second terminal of the first switched capacitor circuit.

In other features, a controller is adapted to switch the first switch between first and second states to vary the capacitance value. The controller switches the first switch at a rate between 10 Hz and 1 kHz.

A substrate processing system includes the TCCT circuit and an RF generator to generate an RF input signal to the TCCT circuit. An RF bias generator biases a substrate support in the ICP chamber. A controller is configured to, during a first half cycle, supply a first capacitance value from the first switched capacitor circuit and to supply the RF input signal at a first amplitude and the RF bias at a second amplitude. During a second half cycle, the controller is configured to supply a second capacitance value from the first switched capacitor circuit, and to supply the RF input signal at a third amplitude and the RF bias at a fourth amplitude. The first capacitance value is different than the second capacitance value. The first amplitude is different than the third amplitude. The second amplitude is different than the fourth amplitude. The controller switches the RF input signal, the RF bias and the capacitance value at a rate between 10 Hz and 1 kHz.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Substrate processing systems and methods according to the present disclosure include transformer coupled capacitive tuning (TCCT) circuits including switched capacitors for impedance matching and/or power splitting. The TCCT circuits typically include motor-controlled vacuum capacitors. With prior designs, capacitance values of the motor-controlled vacuum capacitors can be varied but not at high switching speeds with sub-second TCCT ratio (i.e. inner/outer current ratio) switching. As a result, the TCCT circuits do not adequately support mixed mode pulsing (MMP) operation.

TCCT circuits according to the present disclosure include a new topology and switched capacitor circuits that provide different capacitance values during different phases of pulsed plasma operation. In some examples, the switched capacitor circuits include two or more capacitors and at least one switch (such as fast, high-power metal oxide semiconductor field effect transistor (MOSFET) switch). The switched capacitor circuits provide different capacitance values to dynamically match an impedance of the coils (and changes in the plasma). These and additional features and their advantages are described below in detail.

Figure 1:
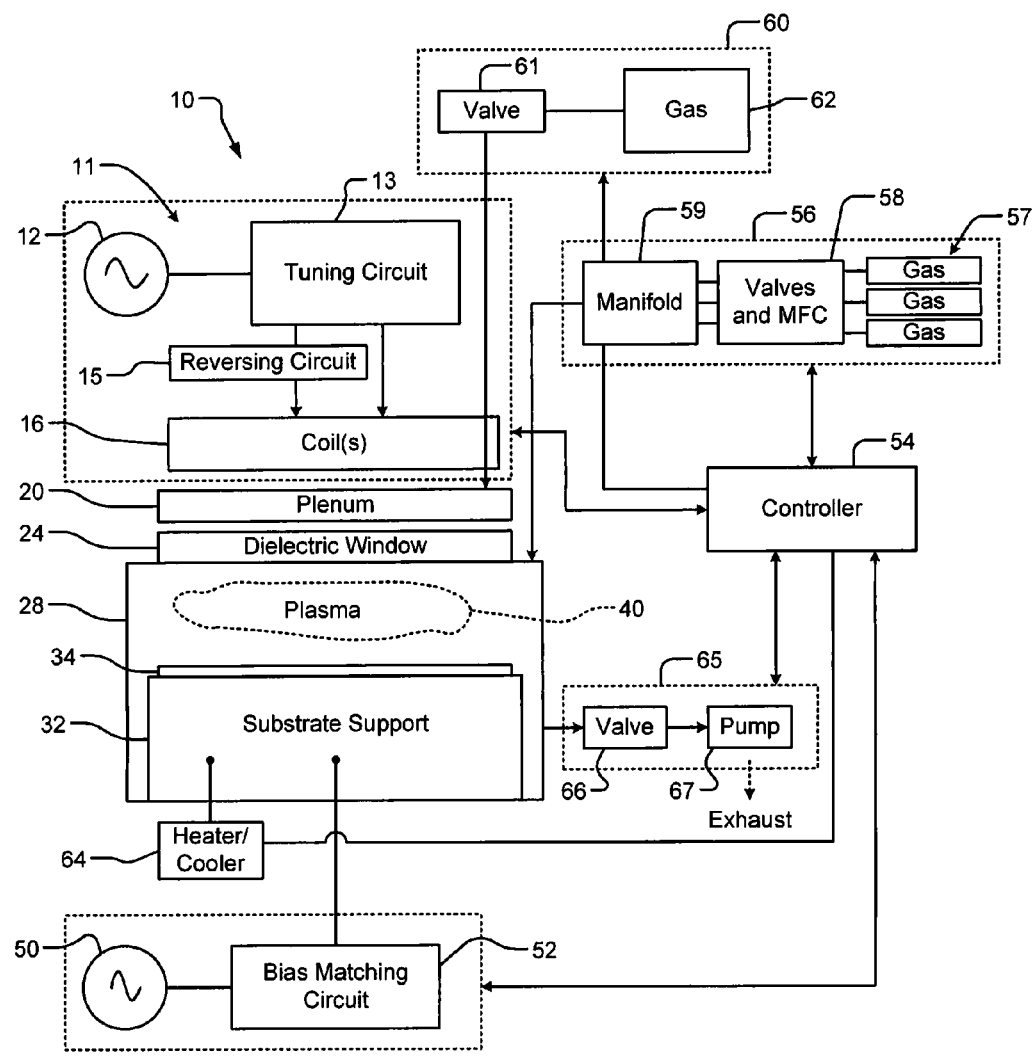
FIG. 1 is a functional block diagram of an example of an inductively coupled plasma (ICP) substrate processing system according to the present disclosure.

Referring now to FIG. 1, an example of a substrate processing system 10 according to the present disclosure is shown. The substrate processing system 10 includes a coil driving circuit 11. In some examples, the coil driving circuit 11 includes an RF source 12 and a tuning circuit 13. The tuning circuit 13 may be directly connected to one or more inductive coils 16. Alternatively, the tuning circuits 13 may be connected by an optional reversing circuit 15 to one or more of the coils 16. The tuning circuit 13 tunes an output of the RF source 12 to a desired frequency and/or a desired phase, matches an impedance of the coils 16 and splits power between the TCP coils 16. The reversing circuit 15 is used to selectively switch the polarity of current through one or more of the TCP coils 16.

Examples of the reversing circuit 15 are shown and described in commonly assigned U.S. patent application Ser. No. 14/673,174 by Sato et al., titled "Systems And Methods For Reversing RF Current Polarity At One Output Of A Multiple Output RF Matching Network," filed Mar. 30, 2015, which is hereby incorporated by reference in its entirety.

In some examples, a plenum 20 may be arranged between the TCP coils 16 and a dielectric window 24 to control the temperature of the dielectric window with hot and/or cold air flow. The dielectric window 24 is arranged along one side of a processing chamber 28. The processing chamber 28 further comprises a substrate support (or pedestal) 32. The substrate support 32 may include an electrostatic chuck (ESC), or a mechanical chuck or other type of chuck. Process gas is supplied to the processing chamber 28 and plasma 40 is generated inside of the processing chamber 28. The plasma 40 etches an exposed surface of the substrate 34. An RF source 50 and a bias matching circuit 52 may be used to bias the substrate support 32 during operation to control ion energy.

A gas delivery system 56 may be used to supply a process gas mixture to the processing chamber 28. The gas delivery system 56 may include process and inert gas sources 57, a gas metering system 58 such as valves and mass flow controllers, and a manifold 59. A gas delivery system 60 may be used to deliver gas 62 via a valve 61 to the plenum 20. The gas may include cooling gas (air) that is used to cool the TCP coils 16 and the dielectric window 24. A heater/cooler 64 may be used to heat/cool the substrate support 32 to a predetermined temperature. An exhaust system 65 includes a valve 66 and pump 67 to remove reactants from the processing chamber 28 by purging or evacuation.

A controller 54 may be used to control the etching process. The controller 54 monitors system parameters and controls delivery of the gas mixture, striking, maintaining and extinguishing the plasma, removal of reactants, supply of cooling gas, and so on. Additionally, as described below in detail, the controller 54 may control various aspects of the coil driving circuit 11, the RF source 50, and the bias matching circuit 52, etc.

Figure 2:
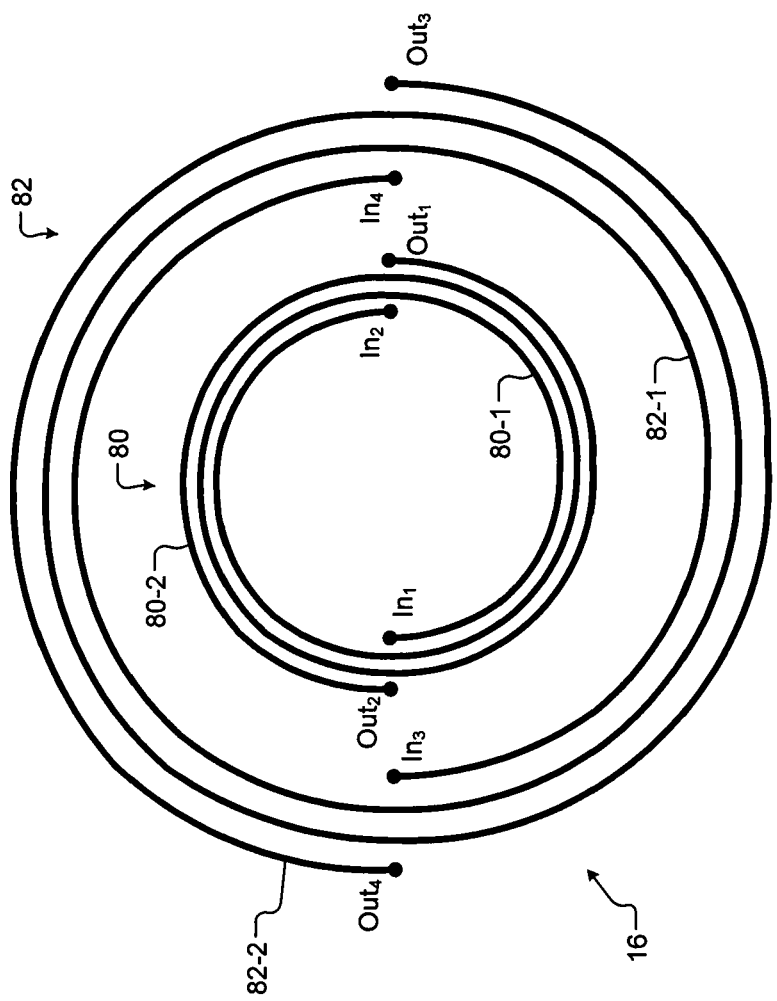
FIG. 2 is a plan view of an example of inner and outer coils according to the present disclosure.

Referring now to FIG. 2, an example of the TCP coils 16 is shown. While a specific coil configuration is shown in FIG. 2, other coil arrangements may be used. The TCP coils 16 may include an inner coil 80 and an outer coil 82. The inner coil 80 includes a first conductor 80-1 having an input end $In_1$ and an output end $Out_1$ and a second conductor 80-2 having an input end $In_2$ and an output end $Out_2$. The first conductor 80-1 and the second conductor 80-2 are wound in a generally circular or looped path adjacent to each other. The outer coil 82 includes a first conductor 82-1 having an input end $In_3$ and an output end $Out_3$ and a second conductor 82-2 having an input end $In_4$ and an output end $Out_4$. The first conductor 82-2 and the second conductor 82-2 are wound in a generally circular or looped path adjacent to each other.

Figure 3:
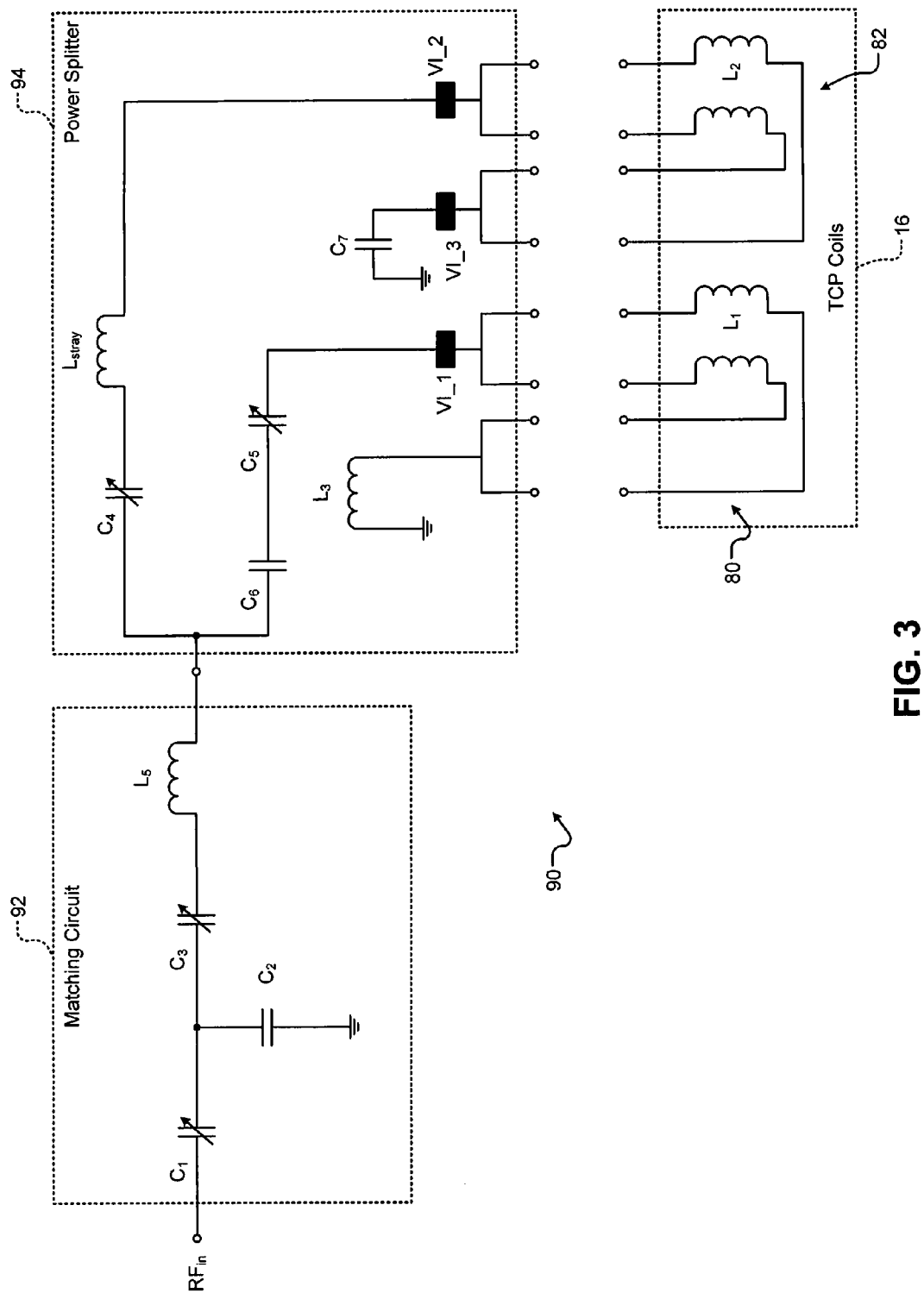
FIG. 3 is an electrical schematic of an example of a transformer coupled capacitive tuning (TCCT) circuit according to the present disclosure.

Referring now to FIG. 3, an example of a TCCT circuit 90 includes a matching circuit 92 and a power splitter 94 that drive the TCP coils 16. The matching circuit 92 receives an RF input signal $RF_{IN}$ from the RF source 12. The matching circuit 92 includes a plurality of capacitors $C_1$, $C_2$, and $C_3$, and an inductor $L_5$. The RF input signal $RF_{IN}$ is received at a first terminal of the capacitor $C_1$. A second terminal of the capacitor $C_1$ is connected to first terminals of the capacitors $C_2$ and $C_3$. A second terminal of the capacitor $C_3$ is connected to a first terminal of the inductor $L_5$.

In some examples, the capacitors $C_1$ and $C_3$ are variable capacitors having capacitance values that are adjusted to match an impedance of the coils (and the plasma). In some examples, the capacitors $C_1$ and $C_3$ are switched capacitor circuits including two or more capacitors and at least one switch. In some examples, the capacitors $C_1$ and $C_3$ include motor-controlled vacuum capacitors. The matching circuit 92 matches the impedance of the RF source 12 to the impedance of the TCP coils 16. Values of the variable capacitors $C_1$ and $C_3$ are varied to match the impedance of the TCP coils 16 during operation as will be described further below. The output of the matching circuit 92 is connected to the power splitter 94.

The power splitter 94 is coupled to the inner and outer coils 80, 82 (i.e., the TCP coils 16) as shown. The power splitter 94 supplies the RF power received from the matching circuit 92 to the inner and outer coils 80, 82. The power splitter 94 includes a plurality of capacitors $C_4$, $C_5$, $C_6$, $C_7$, and inductors $L_{stray}$ (of strap) and $L_3$. A second terminal of the inductor $L_5$ is connected to first terminals of the capacitors $C_4$ and $C_6$. A second terminal of the capacitor $C_4$ is connected to first ends of the coil $L_2$ via the strap (having stray inductance $L_{stray}$). Second ends of the coil $L_2$ are connected to a capacitor $C_7$. A second terminal of the capacitor $C_6$ is connected to a first terminal of the capacitor $C_5$. A second terminal of the capacitor $C_5$ is connected to first ends of the coil $L_1$. Second ends of the coil $L_1$ are connected to the inductor $L_3$.

In some examples, the capacitors $C_4$ and $C_5$ are variable capacitors. In some examples, the variable capacitors $C_4$ and $C_5$ are switched capacitor circuits including two or more capacitors and at least one switch. In some examples, the capacitors $C_4$ and $C_5$ include motor-controlled vacuum capacitors. Values of the capacitors $C_4$ and $C_5$ may be varied in conjunction with (or independently from) the values of the variable capacitors $C_1$ and $C_3$.

In some examples, mixed mode pulsing (MMP) may be used to drive the TCP coils 16 and the substrate support 32. Examples of MMP are shown and described in commonly assigned U.S. patent application Ser. No. 14/863,331 by Long et al., titled "Systems And Methods For Reverse Pulsing," filed Sep. 23, 2015, which is hereby incorporated by reference in its entirety.

Referring now to FIGS. 4A-4D, some examples of MMP are shown. Briefly, in mixed mode pulsing, signals from the RF sources 12 and 50 are synchronized to a clock (shown as Clk), and a signal from the RF source 12 (shown as TCP) is pulsed in in a manner that is alternating or offset in time from a signal from the RF source 50 (shown as RF Bias). Additionally, signal levels of the two signals may vary.

In some examples, the controller 54 shown in FIG. 1 may generate the clock and synchronize the two signals to the clock such that the signal from the RF source 12 is pulsed offset in time from the signal from the RF source 50 as shown in FIGS. 4A-4D. The controller 54 may also control the amplitudes of the two signals as shown.

Figure 4B:
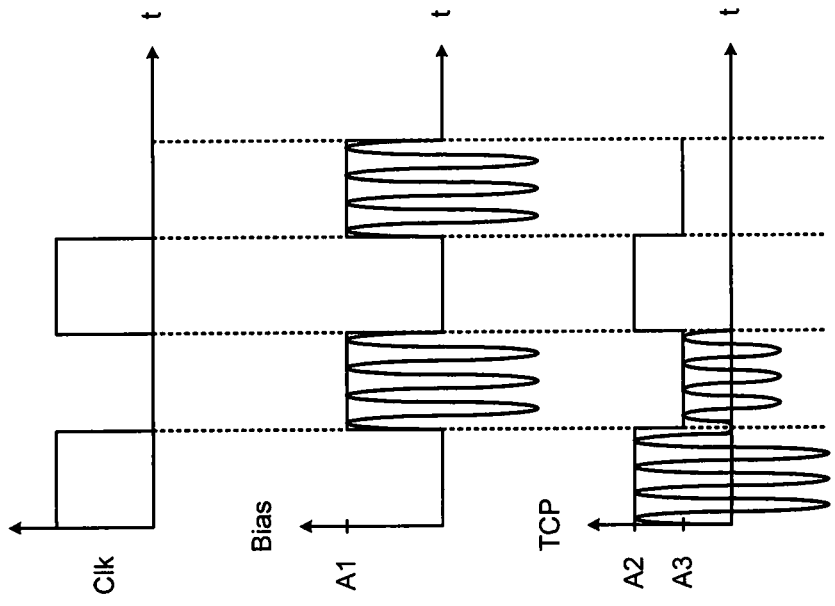
FIGS. 4A-4D are graphs illustrating examples of RF input signals and RF bias signals during some operating modes according to the present disclosure.
Figure 4A:
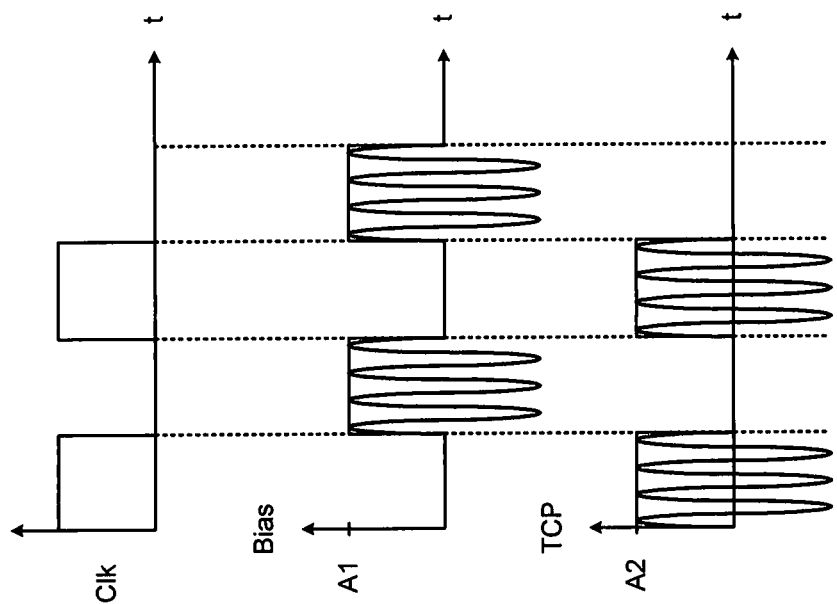

For example, in FIG. 4A, the signal from the RF source 50 may have a level 0 during a first half cycle of the clock and a level A1 during a second half cycle of the clock. The signal from the RF source 12 may have a level A2 during the first half cycle of the clock and a level 0 during the second half cycle of the clock. Alternatively, in FIG. 4B, the signal from the RF source 50 may have a level 0 during a first half cycle of the clock and a level A1 during a second half cycle of the clock. The signal from the RF source 12 may have a level A2 during the first half cycle of the clock and a level A3 during the second half cycle of the clock.

Figure 4C:
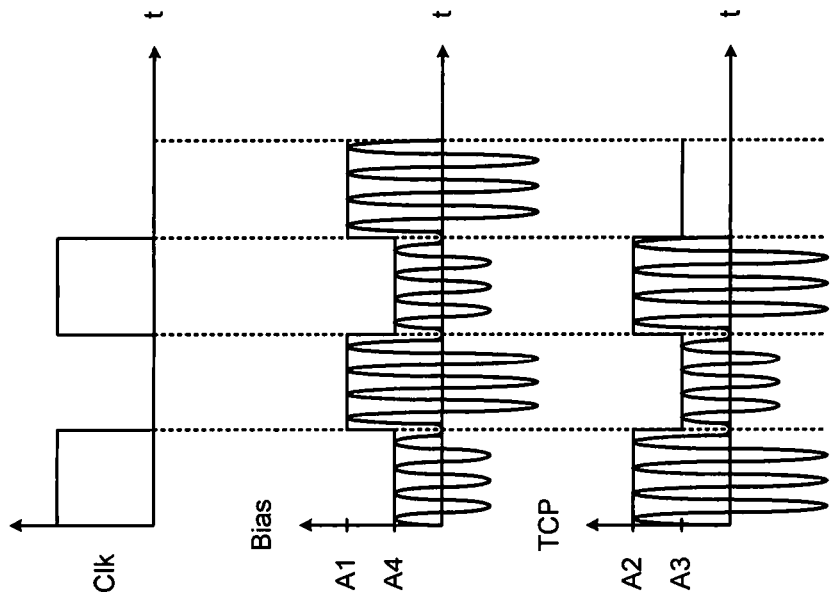
Figure 4D:
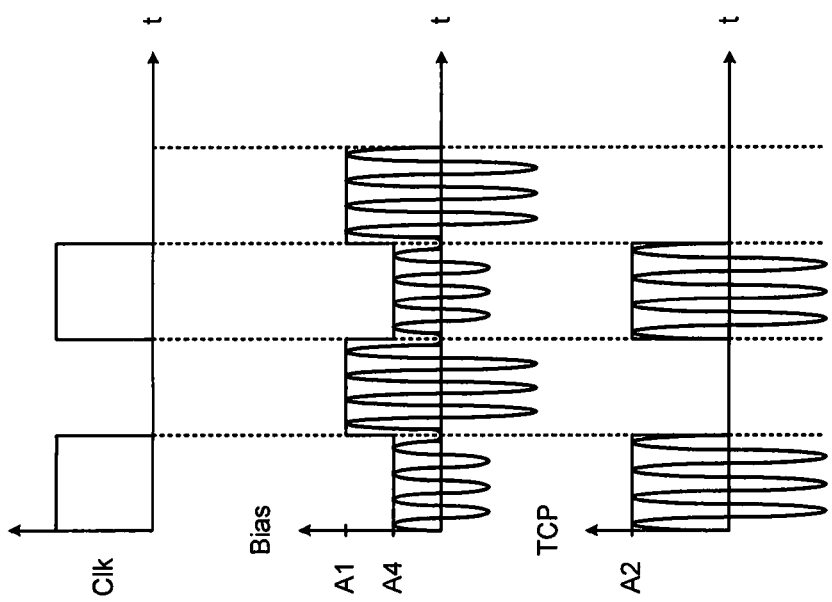

In other examples, in FIG. 4C, the signal from the RF source 50 may have a level A4 during a first half cycle of the clock and a level A1 during a second half cycle of the clock. The signal from the RF source 12 may have a level A2 during the first half cycle of the clock and a level 0 during the second half cycle of the clock. Alternatively, in FIG. 4D, the signal from the RF source 50 may have a level A4 during a first half cycle of the clock and a level A1 during a second half cycle of the clock. The signal from the RF source 12 may have a level A2 during the first half cycle of the clock and a level A3 during the second half cycle of the clock.

In some examples, as further shown and described in commonly assigned U.S. patent application Ser. No. 14/863, 331 by Long et al., each of the RF sources 12 and 50 may include multiple RF signal generators. In each of the RF sources 12 and 50, the multiple RF signals may have different frequencies and different signals levels. The multiple RF signals may be synchronized to the clock signal. The multiple RF signals may be combined to produce combined signals that respectively drive the TCP coils 16 and the substrate support 32 using the mixed mode pulsing.

Figure 5:
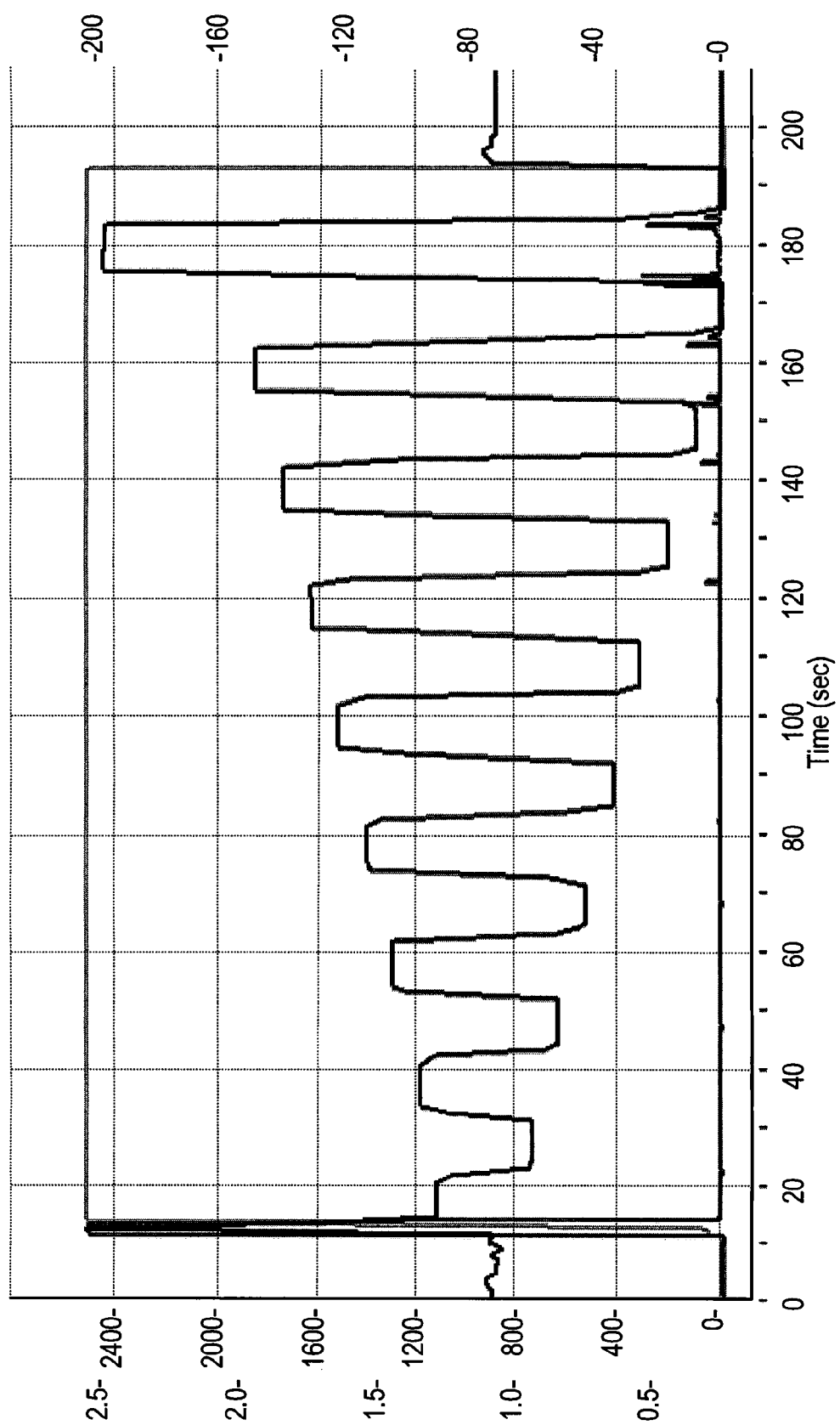
FIG. 5 shows a TCCT switching pattern to enable mixed mode pulsing (MMP) according to the present disclosure.
Figure 6:
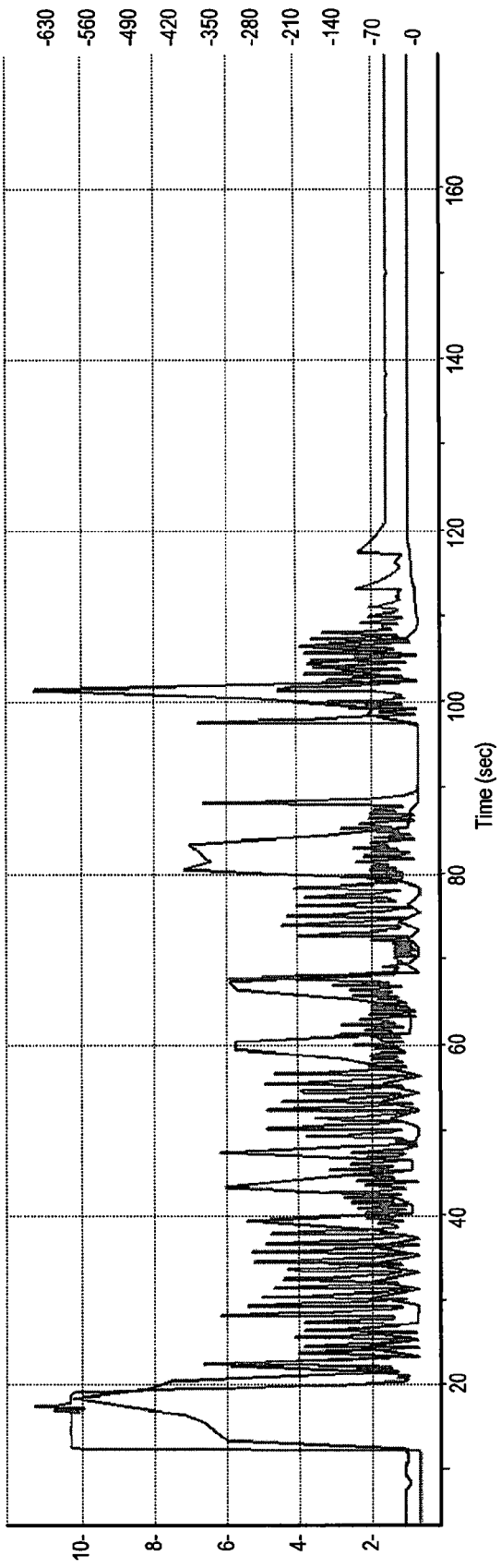
FIG. 6 are graphs illustrating tuning performance of the TCCT circuit shown in FIG. 3 according to the present disclosure.

Referring now to FIGS. 5 and 6, a TCCT switching pattern and tuning performance of the TCCT circuit 90 are shown. The TCCT circuit 90 shown in FIG. 3 is not capable of mixed mode pulsing (MMP) at high switching speeds using solely motor-controlled vacuum capacitor tuning because the tuning response is too slow. For example, when the TCCT switching pattern shown in FIG. 5 is used in the TCCT circuit of FIG. 3, the tuning performance of the TCCT circuit 90 is shown in FIG. 6, which does not have a suitable response. As can be appreciated, the switched capacitor circuits described herein may be used to improve impedance matching response times and overall performance.

Figure 7A:
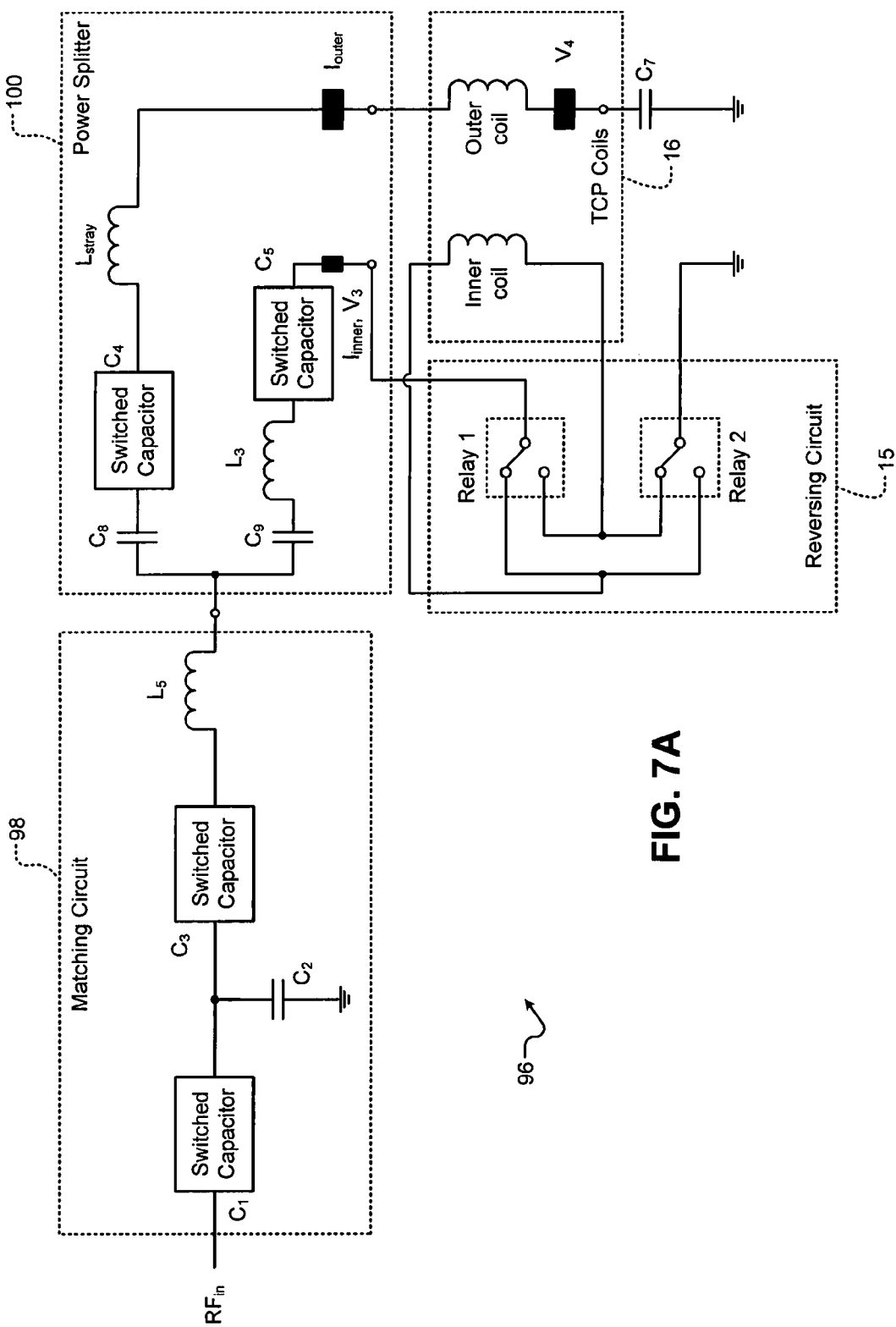
FIGS. 7A and 7B are electrical schematics of examples of TCCT circuits including switched capacitor circuits according to the present disclosure.

Referring now to FIG. 7A, a TCCT circuit 96 includes a matching circuit 98. The matching circuit 98 includes a switched capacitor circuit $C_1$ having a first terminal receiving an RF input signal $RF_{IN}$. The switched capacitor circuit $C_1$ includes a second terminal connected to a first terminal of a capacitor $C_2$ and a first terminal of a switched capacitor circuit $C_3$. In some examples, the switched capacitor circuits $C_1$ and $C_3$ include two or more capacitors and at least one switch. A second terminal of the switched capacitor circuit $C_3$ is connected to a first terminal of an inductor $L_5$.

The second terminal of the inductor $L_5$ is connected to a power splitter 100. More particularly, the second terminal of the inductor $L_5$ is connected to first terminals of capacitors $C_8$ and $C_9$. A second terminal of the capacitor $C_8$ is connected to a first terminal of a variable capacitor $C_4$, which can be a switched capacitor circuit. A second terminal of the variable capacitor $C_4$ is connected by the strap (having stray inductance $L_{stray}$) to a first terminal of the outer coil. A second terminal of the outer coil is connected by a capacitor $C_7$ to a reference potential such as ground.

The second terminal of the capacitor $C_9$ is connected to a first terminal of an inductor $L_3$. A second terminal of the inductor $L_3$ is connected to a first terminal of a variable capacitor $C_5$, which can also be a switched capacitor circuit. A second terminal of the variable capacitor $C_5$ is connected by the reversing circuit 15 to the inner coil, which can also be a switched capacitor circuit.

Figure 7B:
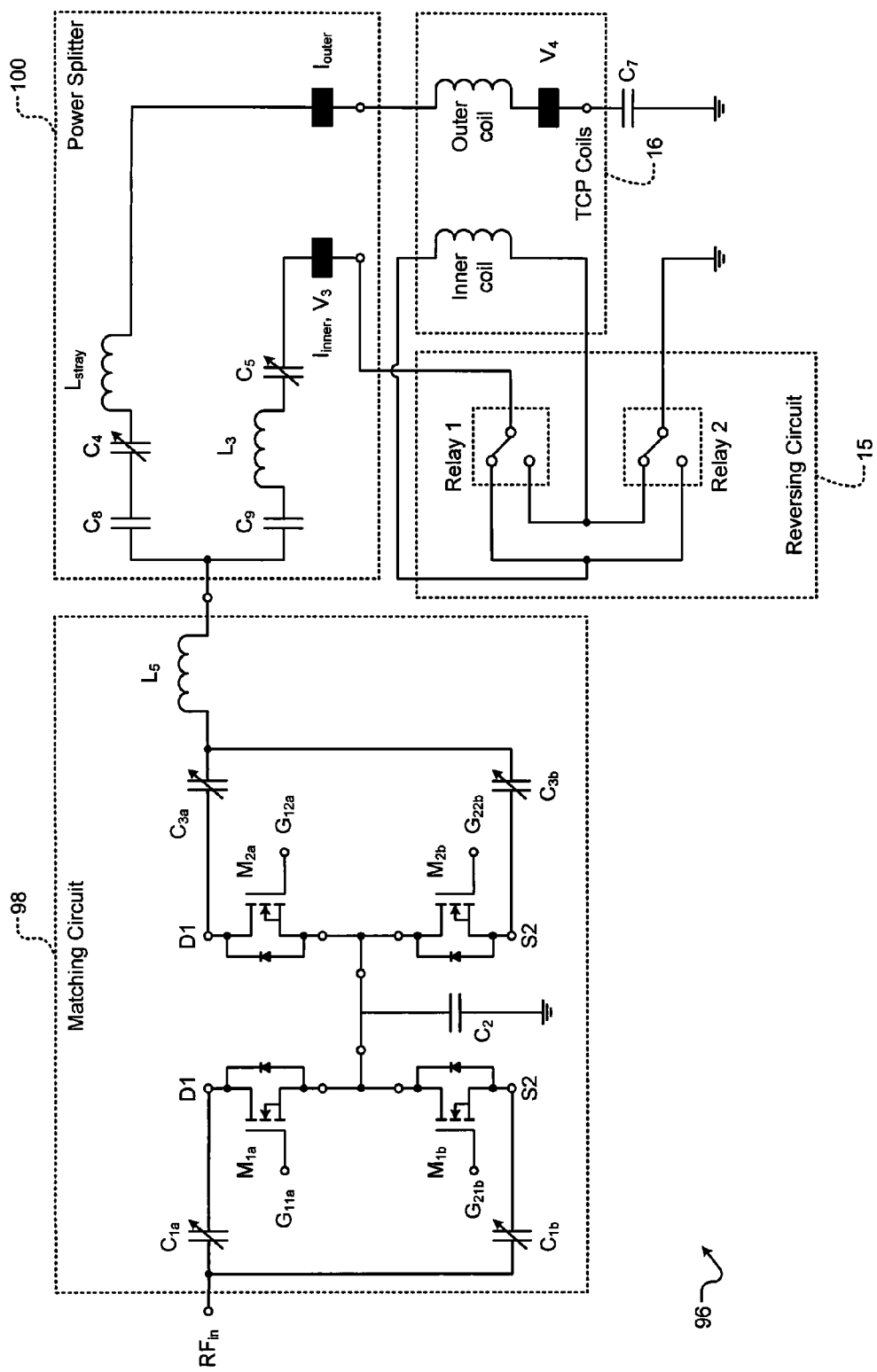

Referring now to FIG. 7B, specific examples of switched capacitor circuits are shown. The switched capacitor circuit $C_1$ includes high power MOSFET switches $M_{1a}$ and $M_{1b}$ and fixed or variable capacitors $C_{1a}$ and $C_{1b}$. In some examples, the capacitors $C_{1a}$ and $C_{1b}$ are motor-controlled vacuum capacitors. First terminals of capacitors $C_{1a}$ and $C_{1b}$ are connected to $RF_{IN}$. Second terminals of capacitors $C_{1a}$ and $C_{1b}$ are connected to first and second terminals of switches $M_{1a}$ and $M_{1b}$, respectively. Second and first terminals of switches $M_{1a}$ and $M_{1b}$, respectively, are connected to a first terminal of the capacitor $C_2$ and to the switched capacitor circuit $C_3$.

The switched capacitor circuit $C_3$ includes switches $M_{2a}$ and $M_{2b}$ and variable capacitors $C_{3a}$ and $C_{3b}$. Second and first terminals of switches $M_{2a}$ and $M_{2b}$, respectively, are connected to the capacitor $C_2$ and the switched capacitor circuit $C_1$. First and second terminals of switches $M_{2a}$ and $M_{2b}$, respectively, are connected to first terminals of variable capacitors $C_{3a}$ and $C_{3b}$. Second terminals of variable capacitors $C_{3a}$ and $C_{3b}$ are connector to inductor $L_5$.

As will be explained further below in detail, the high power MOSFETs are switched to connect different combinations of the variable capacitors to the power splitter 100 to match the impedance of the TCP coils 16 (and plasma) during operation.

In the matching circuit 98, the high speed impedance tuning capability is achieved by operating the switches $M_{1a}$, $M_{1b}$, $M_{2a}$, and $M_{2b}$ as follows. $M_{1a}$, $M_{1b}$, $M_{2a}$, and $M_{2b}$ are turned on and off by controlling corresponding gate drive signals to connect $C_{1a}$ and $C_{3a}$ to the power splitter 100 for one level while $C_{1b}$ and $C_{3b}$ are disconnected. Then, $C_{1b}$ and $C_{3b}$ are connected to the power splitter 100 for another level while $C_{1a}$ and $C_{3a}$ are disconnected. The controller 54 (shown in FIG. 1) may perform switching within each pulse between the levels (see FIGS. 4A-4D for different pulsing examples). In some examples, the switching is performed at a frequency between 10 Hz and 1 kHz.

Figure 8:
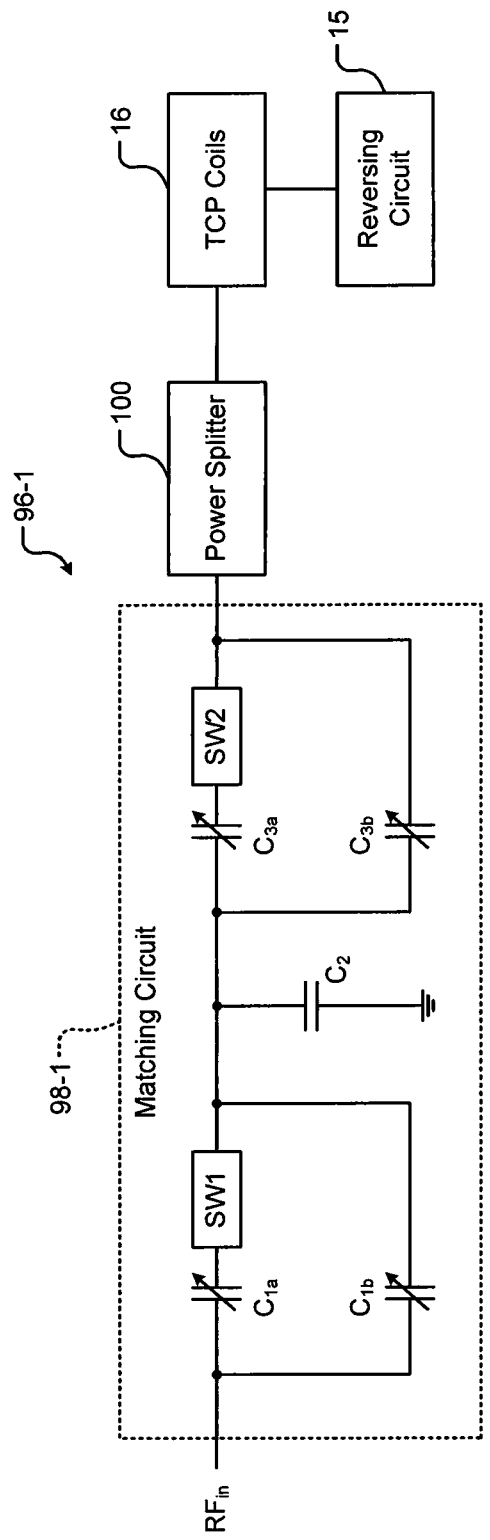
FIG. 8 is a functional block diagram showing an additional example of a switched capacitor circuit according to the present disclosure.

In FIG. 8, a TCCT circuit 96-1 includes a matching circuit 98-1, the power splitter 100, the TCP coils 16, and the reversing circuit 15. The matching circuit 98-1 includes a first switched capacitor circuit including a capacitance $C_{1a}$ and a switch SW1 connected in series and a capacitance $C_{1b}$ connected in parallel across the capacitance $C_{1a}$ and the switch SW1. The matching circuit 98-1 includes a second switched capacitor circuit including a capacitance $C_{3a}$ and a switch SW2 connected in series and a capacitance $C_{3b}$ connected in parallel across the capacitance $C_{3a}$ and the switch SW2.

Within each pulse, the switches SW1 and SW2 are turned off to connect only $C_{1b}$ and $C_{3b}$ to the power splitter 100 for the first level while disconnecting $C_{1a}$ and $C_{3a}$, and closed to connect the parallel combination of $C_{1a}$ and $C_{1b}$ and $C_{3a}$ and $C_{3b}$ to the power splitter 100 for the second level.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A transformer coupled capacitive tuning (TCCT) circuit for an inductively coupled plasma (ICP) chamber, comprising:
    a matching circuit including:
        a first switched capacitor circuit and a first inductor, wherein the first switched capacitor circuit includes:
            a first terminal connected to an RF input;
            a second terminal;
            a first capacitor connected to at least one of the first terminal and the second terminal;
            a second capacitor connected to at least one of the first terminal and the second terminal; and
            a first switch in communication with at least one of the first capacitor and the second capacitor to vary a capacitance value between the first terminal and the second terminal; and
        a second switched capacitor circuit including:
            a third terminal connected to the second terminal of the first switched capacitor circuit;
            a fourth terminal connected to the first inductor;
            a third capacitor connected to at least one of the third terminal and the fourth terminal;
            a fourth capacitor connected to at least one of the third terminal and the fourth terminal; and
            a second switch in communication with at least one of the third capacitor and the fourth capacitor to vary a capacitance value between the third terminal and the fourth terminal; and
    the TCCT circuit further comprising:
        a fifth capacitor, wherein a first terminal of the fifth capacitor is connected to the second terminal of the first switched capacitor circuit and to the third terminal of the second switched capacitor circuit, and wherein a second terminal of the fifth capacitor is connected to ground; and
    a power splitter in communication with the matching circuit and an inductive coil of the ICP chamber.

2. The TCCT circuit of claim 1, wherein the first capacitor and the second capacitor include motor-controlled vacuum capacitors.

3. The TCCT circuit of claim 1, wherein the third capacitor and the fourth capacitor include motor-controlled vacuum capacitors.

4. The TCCT circuit of claim 1, wherein:
    the first capacitor is connected to the first terminal of the first switched capacitor circuit,
    the second capacitor is connected to the first terminal of the first switched capacitor circuit, and
    the first switch is connected between the first capacitor and the second terminal of the first switched capacitor circuit; and
    the first switched capacitor circuit further includes a third switch connected between the second capacitor and the second terminal of the first switched capacitor circuit.

5. The TCCT circuit of claim 1, wherein:
    the first capacitor is connected to the first terminal of the first switched capacitor circuit,
    the second capacitor is connected to the first terminal and the second terminal of the first switched capacitor circuit, and
    the first switch is connected between the first capacitor and the second terminal of the first switched capacitor circuit.

6. The TCCT circuit of claim 1, further comprising a controller adapted to switch the first switch between first and second states to vary the capacitance value.

7. The TCCT circuit of claim 6, wherein the controller switches the first switch at a rate between 10 Hz and 1 kHz.

8. The TCCT circuit of claim 1, wherein:
    the third capacitor is connected to the fourth terminal of the second switched capacitor circuit,
    the fourth capacitor is connected to the fourth terminal of the second switched capacitor circuit, and
    the second switch is connected between the third capacitor and the third terminal of the second switched capacitor circuit; and
    the second switched capacitor circuit further includes a third switch connected between the fourth capacitor and the third terminal of the second switched capacitor circuit.

9. The TCCT circuit of claim 1, wherein:
    the third capacitor is connected to the fourth terminal of the second switched capacitor circuit,
    the fourth capacitor is connected to the fourth terminal and the third terminal of the second switched capacitor circuit, and
    the second switch is connected between the third capacitor and the third terminal of the second switched capacitor circuit.

10. A transformer coupled capacitive tuning (TCCT) circuit for an inductively coupled plasma (ICP) chamber, comprising:
    a matching circuit including a first switched capacitor circuit and a first inductor,
    wherein the first switched capacitor circuit includes:
        a first terminal;
        a second terminal;
        a first capacitor connected to at least one of the first terminal and the second terminal;

a second capacitor connected to at least one of the first terminal and the second terminal; and
a first switch in communication with at least one of the first capacitor and the second capacitor to vary a capacitance value between the first terminal and the second terminal; and
a power splitter in communication with the matching circuit and an inductive coil of the ICP chamber, wherein the power splitter includes:
a third capacitor having a first terminal connected to an output of the matching circuit;
a fourth capacitor having a first terminal connected to a second terminal of the third capacitor and a second terminal in communication with a first coil;
a fifth capacitor having a first terminal connected to the output of the matching circuit;
a second inductor including a first terminal connected to a second terminal of the fifth capacitor;
a sixth capacitor having a first terminal connected to a second terminal of the second inductor and a second terminal connected to a second coil; and
a seventh capacitor connected to the first coil.

11. The TCCT circuit of claim 10, wherein the fourth capacitor and the sixth capacitor include switched capacitor circuits.

12. A substrate processing system comprising:
a transformer coupled capacitive tuning (TCCT) circuit for an inductively coupled plasma (ICP) chamber, comprising:
a matching circuit including a first switched capacitor circuit and a first inductor,
wherein the first switched capacitor circuit includes:
a first terminal;
a second terminal;
a first capacitor connected to at least one of the first terminal and the second terminal;
a second capacitor connected to at least one of the first terminal and the second terminal; and
a first switch in communication with at least one of the first capacitor and the second capacitor to vary a capacitance value between the first terminal and the second terminal; and
a power splitter in communication with the matching circuit and an inductive coil of the ICP chamber; and
the substrate processing system further comprising:
an RF generator to generate an RF input signal to the TCCT circuit;
an RF bias generator to bias a substrate support in the ICP chamber; and
a controller configured to:
during a first half cycle, supply a first capacitance value from the first switched capacitor circuit, and supply the RF input signal at a first amplitude and the RF bias at a second amplitude; and
during a second half cycle, supply a second capacitance value from the first switched capacitor circuit, and supply the RF input signal at a third amplitude and the RF bias at a fourth amplitude,
wherein the first capacitance value is different than the second capacitance value, and wherein the first amplitude is different than the third amplitude and the second amplitude is different than the fourth amplitude.

13. The system of claim 12, wherein the controller switches the RF input signal, the RF bias and the capacitance value at a rate between 10 Hz and 1 kHz.

* * * * *